(12) United States Patent
Reblewski et al.

(10) Patent No.: US 6,265,894 B1
(45) Date of Patent: Jul. 24, 2001

(54) RECONFIGURABLE INTEGRATED CIRCUIT WITH INTEGRATED DEBUGGING FACILITIES FOR USE IN AN EMULATION SYSTEM

(76) Inventors: Frederic Reblewski; Olivier Lepape, both of 2 rue Antoine Roucher, 75016 Paris (FR)

( * ) Notice: Subject to any disclaimer, the term of this patent is extended or adjusted under 35 U.S.C. 154(b) by 0 days.

(21) Appl. No.: 09/404,925

(22) Filed: Sep. 24, 1999

Related U.S. Application Data

(63) Continuation-in-part of application No. 08/985,372, filed on Dec. 4, 1997, which is a continuation of application No. 08/542,838, filed on Oct. 13, 1995, now Pat. No. 5,777,489.

(51) Int. Cl.[7] .......................... H03K 19/177; H03K 19/00
(52) U.S. Cl. ................................................. 326/39; 326/16
(58) Field of Search ............................... 326/16, 39, 37; 714/726, 741, 28

(56) References Cited

U.S. PATENT DOCUMENTS

| | | | |
|---|---|---|---|
| 5,068,603 | * 11/1991 | Mahoney | 714/726 |
| 5,132,974 | * 7/1992 | Rosales | 714/731 |
| 5,623,503 | * 4/1997 | Rutkowski | 714/727 |
| 5,636,228 | * 6/1997 | Moughanni et al. | 714/726 |
| 5,777,489 | * 7/1998 | Barbier et al. | 326/40 |

OTHER PUBLICATIONS

Park et al., Partial Scan Design Based on Levellised Combinational Structure, IEE Proc. Comput. Digit. Tech. vol. 145, No. 4, Jul., 1998.*

* cited by examiner

Primary Examiner—Michael Tokar
Assistant Examiner—James H Cho
(74) Attorney, Agent, or Firm—Columbia IP Law Group, PC

(57) ABSTRACT

An integrated circuit is described as comprising a plurality of logic elements (LEs), each of which having a plurality of outputs, and a partial scan register. The plurality of LEs are operative to generate a plurality of output signals in response to a plurality of input signals correspondingly applied to the LEs. The partial scan register is reconfigurably coupled to select ones of the LEs such that, when enabled, the partial scan register is operative to capture and output on a scan bus a record of signal state values circuit elements emulated by the selected LEs in a particular clock cycle of an operating clock, wherein the partial scan register is enabled with application of a scan clock appropriately scaled to the operating clock.

23 Claims, 13 Drawing Sheets

RECONFIGURABLE INTEGRATED CIRCUIT WITH INTEGRATED DEBUGGING FACILITIES FOR USE IN AN EMULATION SYSTEM

RELATED APPLICATIONS

This application is a continuation-in-part of U.S. patent application Ser. No. 08/985,372, filed Dec. 4, 1997, which is a continuation of U.S. patent application Ser. No. 08/542,838 entitled "A Field Programmable Gate Array with Integrated Debugging Facilities" filed on Oct. 13, 1995, now U.S. Pat. No. 5,777,489, by Barbier, et al., and commonly assigned to the assignee of the present invention.

BACKGROUND OF THE INVENTION

1. Field of the Invention

The present invention relates to the fields of emulation systems in general and, in particular, to a reconfigurable integrated circuit with integrated debugging facilities for use in an emulation system.

2. Background Information

Emulation systems for emulating circuit design are known in the art. Typically, prior art emulation systems are formed using general purpose field programmable gate arrays (FPGA's) without integrated debugging facilities. A circuit design to be emulated is "realized" on the emulation system by compiling a "formal" description of the circuit design, and mapping the circuit design onto the logic elements (LEs) (also known as combinatorial logic blocks (CLBs)) of the FPGAs. These general purpose FPGAs, as far as their applications to emulation systems are concerned, have a number of disadvantages. First of all, the states of signals at individual nodes mapped inside of the FPGAs are not directly observable, thus the term "hidden" nodes. In order to be able to observe the states of signals at these "hidden" nodes, reconfiguration of the FPGAs, requiring an extremely time consuming recompilation, is required to bring these signals outside the FPGAs to a logic analyzer. In addition, a number of the FPGA I/Os are typically consumed in order to bring these signals to a port/node which is observable (traceable) by a test system, e.g., a logic analyzer. Furthermore, the additional signals to be routed further increase signal routing congestion. Finally, for time sensitive applications, it is difficult to know whether the signals at these "hidden" nodes were read at precisely the correct time or not, if the signals are to be read in response to the occurrence of certain events, since the signals have to be brought out of the FPGAs before the read triggering events can be detected. As the emulators have grown more complex, so too have the network of FPGAs and interconnecting traces, further exacerbating the problems above. As the time required for monitoring traces exhaustively increases with the increased complexity, the frequency at which the emulation can proceed is diminished to unacceptable levels.

Thus, what is required is a reconfigurable integrated circuit with integrated debugging facilities which facilitates access to once hidden nodes and traces while reducing the need for reconfiguration, thereby facilitating emulation at acceptable emulation frequencies. As will be described in more detail below, the present invention provides for just such a reconfigurable integrated circuit with integrated debugging facilities that achieves these and other desired results, which will be apparent to those skilled in the art from the description to follow.

SUMMARY OF THE INVENTION

In accordance with the teachings of the present invention, a reconfigurable integrated circuit (IC) with integrated debugging facilities for use in an emulation system is described. In particular, in accordance with a first embodiment of the present invention, an integrated circuit is described as comprising a plurality of logic elements (LEs), each of which having a plurality of outputs, and a partial scan register. The plurality of LEs are operative to generate a plurality of output signals in response to a plurality of input signals correspondingly applied to the LEs. The partial scan register is reconfigurably coupled to select ones of the LEs such that, when enabled, the partial scan register is operative to capture and output on a scan bus a record of signal state values circuit elements emulated by the selected LEs in a particular clock cycle of an operating clock, wherein the partial scan register is enabled with application of a scan clock appropriately scaled to the operating clock.

BRIEF DESCRIPTION OF DRAWINGS

The present invention will be described by way of exemplary embodiments, but not limitations, illustrated in the accompanying drawings in which like references denote similar elements, and in which.

DETAILED DESCRIPTION OF THE INVENTION

In the following description, for purposes of explanation, specific numbers, materials and configurations arc set forth in order to provide a thorough understanding of the present invention. However, it will be apparent to one skilled in the art that the present invention may be practiced without the specific details. In other instances, well known features are omitted or simplified in order not to obscure the present invention.

Reference in the specification to "one embodiment" or "an embodiment" means that a particular feature, structure or characteristic described in connection with the embodiment is included in at least one embodiment of the present invention. Thus, the appearances of the phrase "in one embodiment" appearing in various places throughout the specification are not necessarily all referring to the same embodiment.

Figure 1:
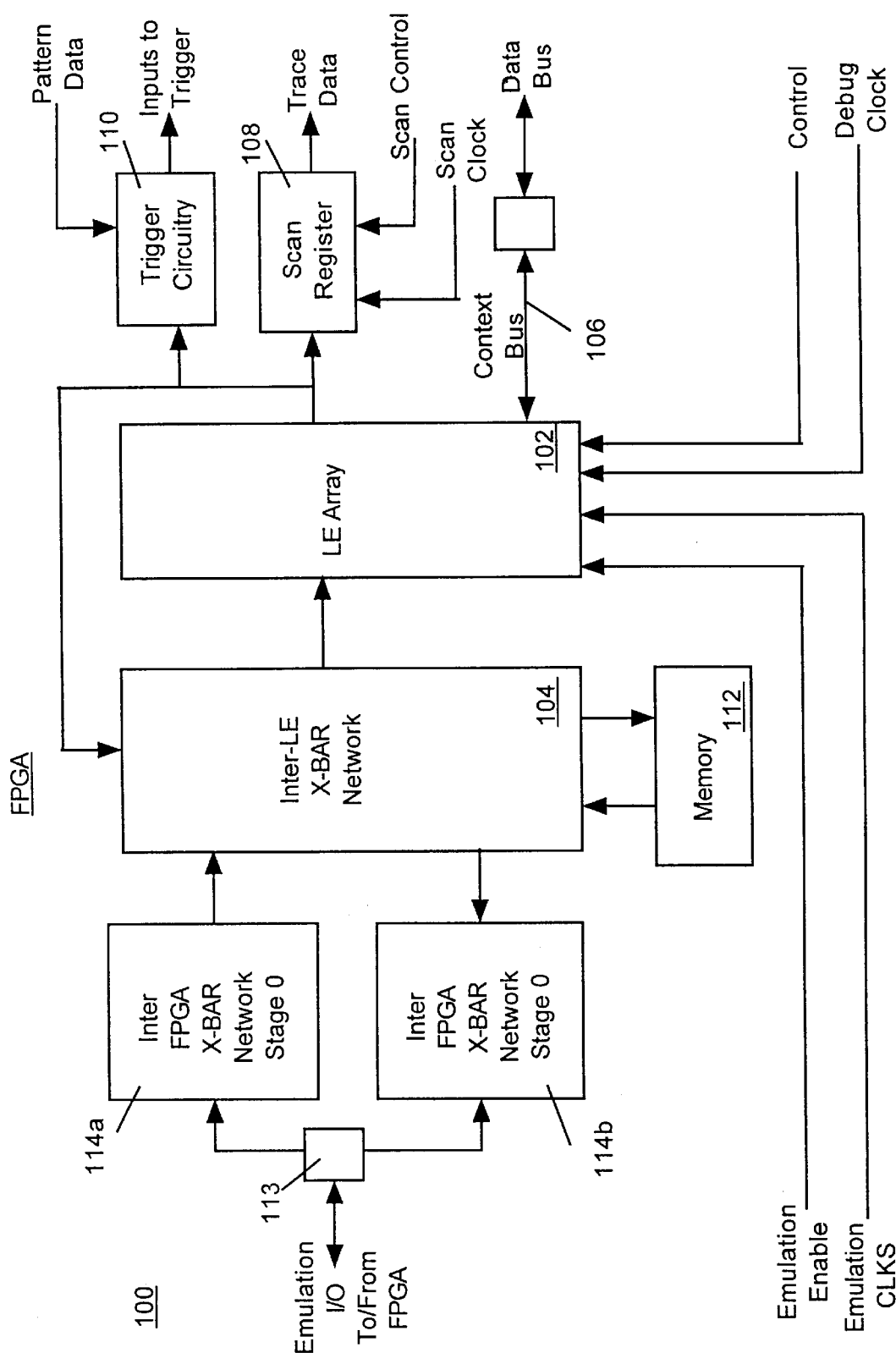
FIG. 1 illustrates the major functional blocks of the reconfigurable circuit of the present invention.

Referring now to FIG. 1, a block diagram illustration of an example reconfigurable integrated circuit 100 incorporating the teachings of the present invention is illustrated. As will be apparent, from the descriptions to follow, reconfigurable circuit 100 is intended to represent any of a number of reconfigurable integrated circuits known in the art. In one embodiment, for example, reconfigurable circuit 100 is a reconfigurable circuit enhanced to incorporate the teachings of the present invention. In accordance with one embodiment of the present invention, reconfigurable circuit 100 is disposed on a single integrated circuit (or chip) and comprises an array of enhanced LEs 102. The array of enhanced LEs 102 is used to "realize" various elements of circuit designs, and include innovative debugging features.

Additionally, reconfigurable circuit 100 further advantageously includes an on-chip context bus 106, scan register 108 and trigger circuitry 110, coupled to the enhanced LEs 102 as shown. As will be disclosed in more detail below, context bus 106 is used for inputting and outputting values to and from the LEs, whereas scan register 108 and trigger circuitry 110 are used to output complete trace data history and trigger inputs for reconfigurable circuit 100 respectively. In accordance with the teachings of the present invention, to be described more fully below, reconfigurable circuit 100 is shown comprising dynamically reconfigurable network 137 and partial scan register 135, which are used to selectively output a partial trace history for select LEs 102 of reconfigurable circuit 100. That is, unlike prior art emulator circuits which only provide for exhaustive scan output from statically defined "visible" nodes within the circuit (otherwise requiring recompilation and I/O resource allocation to view "hidden" node), circuit 100 includes dynamically reconfigurable network 137 and partial scan register 135 which provides dynamic "visibility" to any trace/node within the array of LE's 102 without the need for recompilation.

In one embodiment of the present invention, reconfigurable circuit 100 includes memory 112 to facilitate usage of reconfigurable circuit 100 for emulating circuit designs with memory. In one embodiment, memory 112 is a 16-bit memory device. In alternate embodiments, memory 112 may well be 32-bits wide, or alternatively 64-bits wide. In one embodiment, the pins 113 of reconfigurable circuit 100 can be used for either input or output. In one embodiment, 64 I/O pins 113 are provided within reconfigurable circuit 100. In accordance with the illustrated example embodiment, reconfigurable circuit 100 also includes inter-LE crossbar (or x-bar) network 104 for interconnecting the LEs, memory 112, and I/O pins 113, as shown. In one embodiment, reconfigurable circuit 100 to includes "two copies" of the first stage of a crossbar network 114a–114b for interconnecting reconfigurable circuit 100 to other such reconfigurable circuits and a "host system" (not shown).

Memory 112 is well known in the art and will not be further described. Inter-LE crossbar network 104 and the first stage of inter-circuit crossbar network 114a–114b are described in detail in U.S. Pat. No. 5,574,388, entitled "An emulation system employing a multi-level and multi-stage network topology for interconnecting reconfigurable logic devices", and having at least one inventor and common assignee interest as the present invention, the disclosure of which is hereby expressly incorporated by reference. Nevertheless, network 104 and network stage 114a–114b will be briefly described below.

LEs 102, context bus 106, scan register 108, partial scan register 135, dynamically reconfigurable network 137, and trigger circuitry 110 will be described in further detail below with additional references to the remaining figures. Before describing these elements in further detail, it should be noted that while for ease of explanation, the present invention is being described in the context of emulation, however, based on the description to follow, a person ordinarily skilled in the art will appreciate that the present invention may be adapted for other applications in addition to emulation systems.

Further, it should be noted that, in the context of dynamically reconfigurable network 137, use of the term dynamically reconfigurable is intended to mean that although the emulation of circuit elements may (or may not) need to be paused to reconfigure dynamically reconfigurable network 137, the emulation need not be restarted from the beginning of the emulation. More specifically, the reconfiguration of dynamically reconfigurable network 137 does not require recompilation, while reconfiguration of the interconnect network 104 does require recompilation which, as alluded to above, is a time consuming process. Accordingly, those skilled in the art will appreciate that dynamically reconfigurable network 137 provides an efficient means by which otherwise hidden nodes of interest in an LE 102 are accessed (via the partial scan register 135) to facilitate rapid debugging of emulator and/or the circuit to be emulated.

Although FIG. 1 presents a separate scan register, i.e., the partial scan register 135 as working in conjunction with dynamically reconfigurable network 137 to access any trace/node within the array of LE's 102, those skilled in the art will appreciate that this is by example only, and that other suitable embodiments exist. One such embodiment is presented, for example, with reference to FIG. 11.

Figure 11:
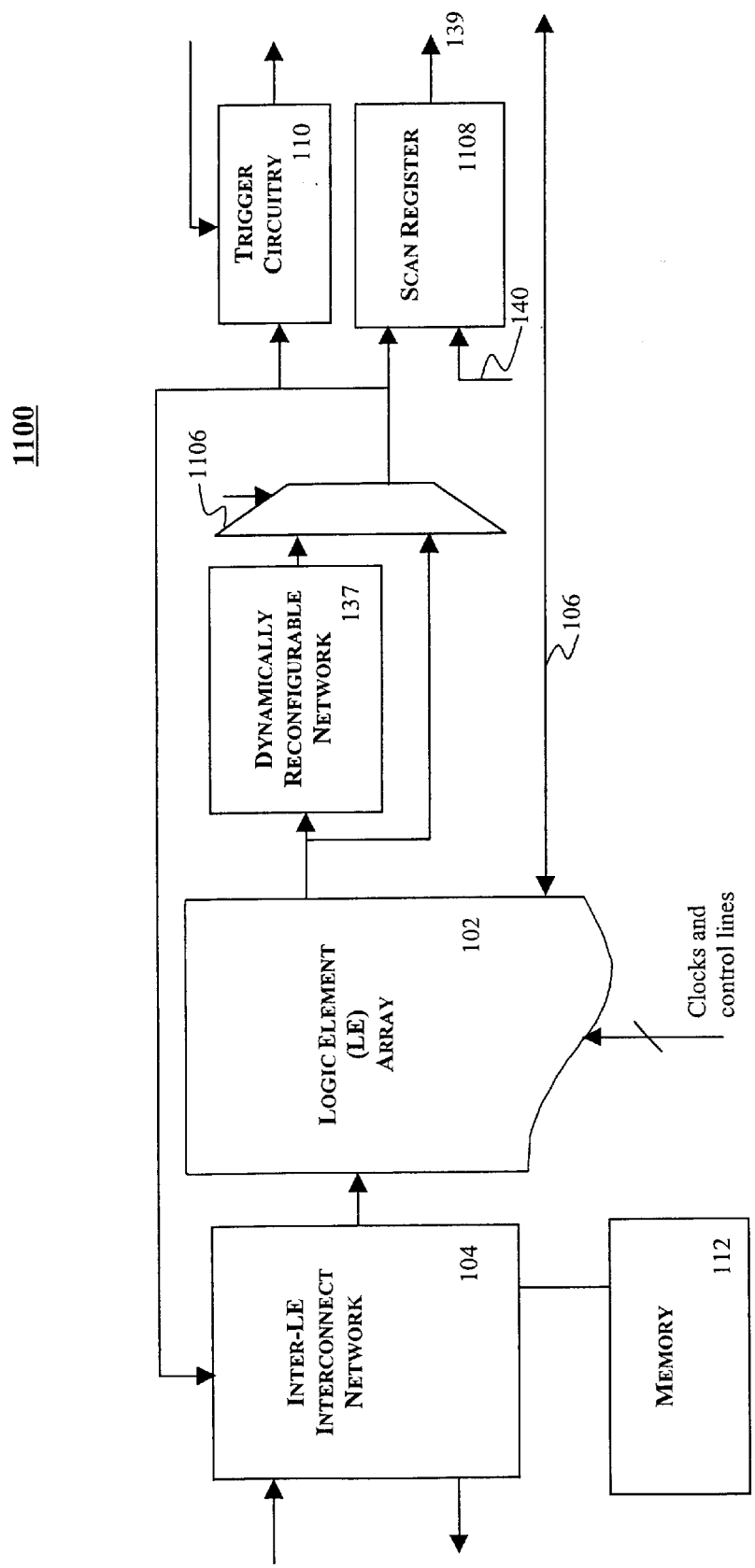
FIG. 11 illustrates a block diagram of an example reconfigurable circuit incorporating the teachings of the present invention, in accordance with an alternate embodiment of the present invention.
Figure 1:
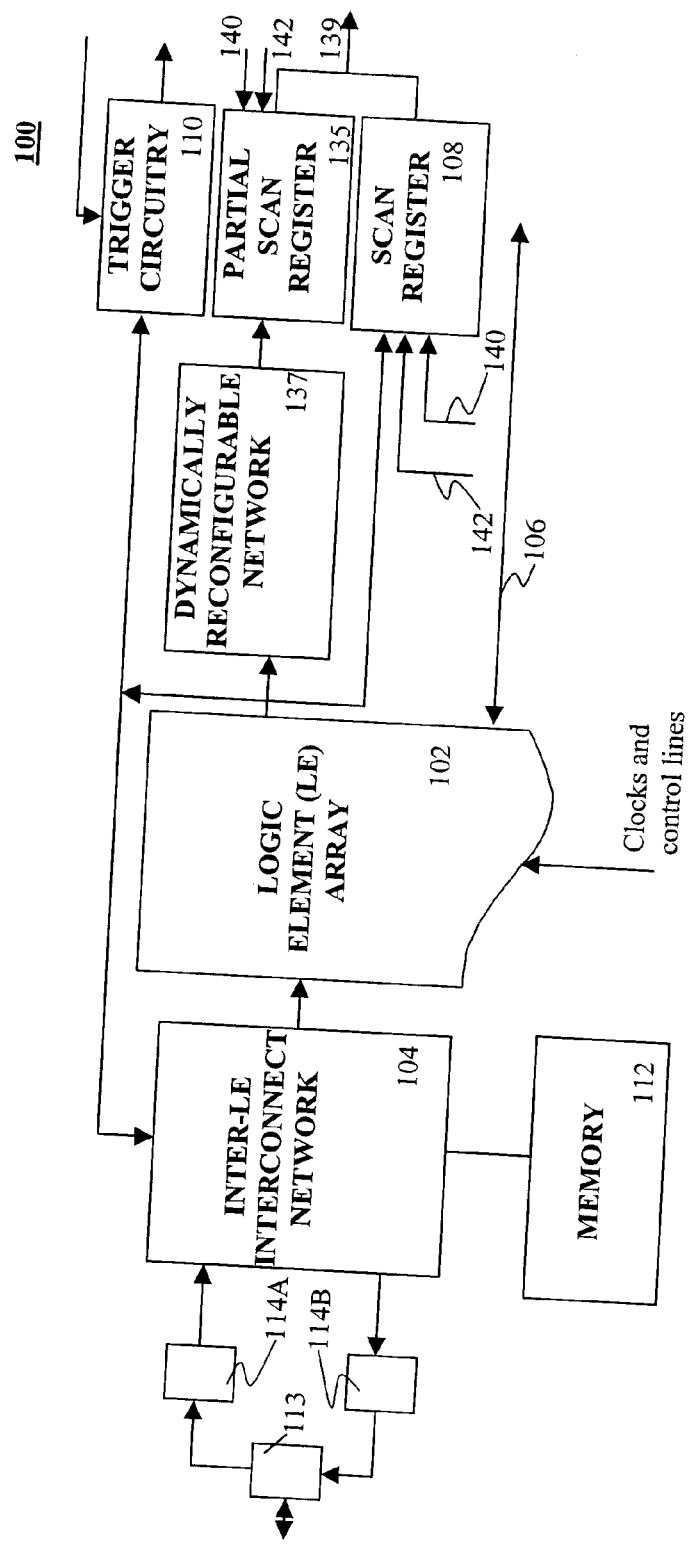
Figure 11:
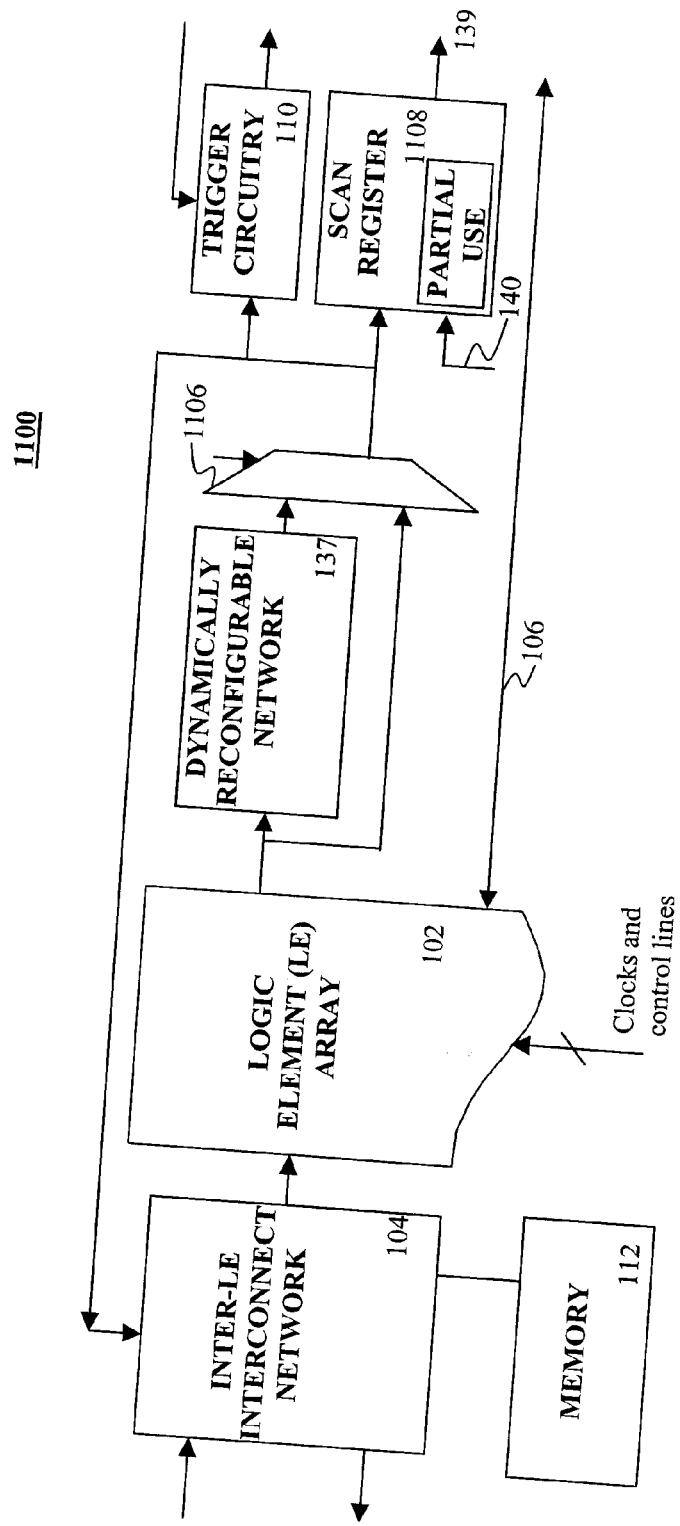

As shown, FIG. 11 depicts a block diagram of reconfigurable circuit 1100. Those skilled in the art will recognize that reconfigurable circuit 1100 is very similar to that of reconfigurable circuit 100. That is, reconfigurable circuit 1100 employs array of LEs 102, memory 112, dynamically reconfigurable network 137 and trigger circuitry 110, each communicatively coupled as depicted. Reconfigurable circuit 1100 is distinct from reconfigurable circuit 100, however, in that reconfigurable circuit 1100 requires but one scan register 1108 in conjunction with multiplexer 1106 to exhaustively monitor all trace/node activity, or merely a select subset thereof That is, rather than employing a separate partial scan register 135 and (exhaustive) scan register 108, the reconfigurable circuit 1100 utilizes multiplexer 1106 to selective supply scan register 1108 with the output of all traces/node in an exhaustive scan mode, or a select subset of the traces/nodes in a partial scan mode. In other words, scan register 1108 may be fully employed as scan register 108 of FIG. 1 or partially employed as partial scan register 135 of FIG. 1.

Given the foregoing alternate embodiments, those skilled in the art will appreciate that the present invention may well be practiced in still further embodiments without deviating from the spirit and scope of the present invention. Indeed, such alternate embodiments are anticipated by the disclosure of the present invention. Having described alternate embodiments of the innovative reconfigurable circuit 200 and 1100, respectively, attention is drawn to FIG. 2, wherein the array of enhanced LE's is further described.

Figure 2:
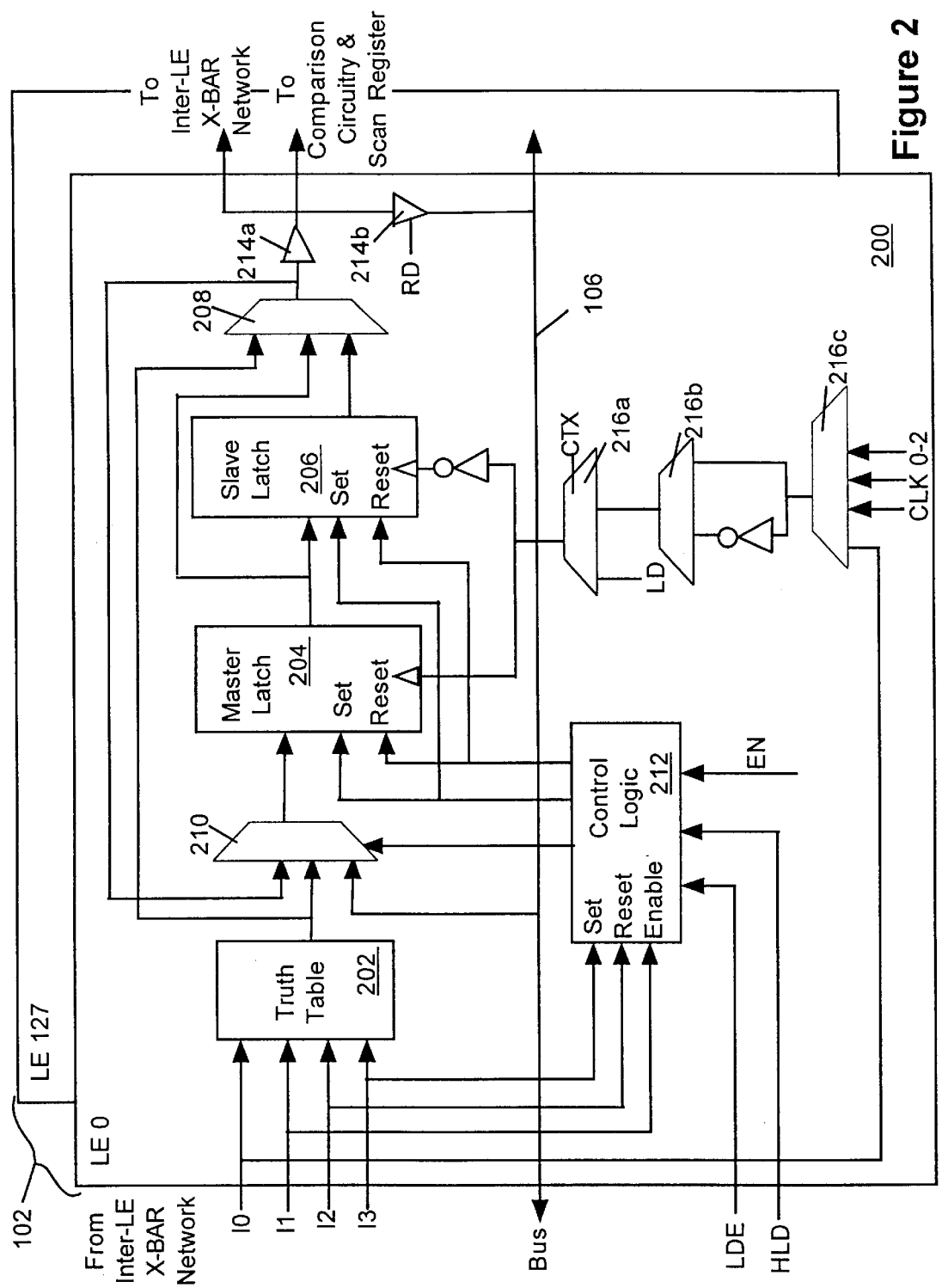
FIG. 2 illustrates one embodiment of the LE array of FIG. 1, and one embodiment of the enhanced LE.

Turning now to FIG. 2, a block diagram illustration of an example array of enhanced LEs, suitable for use in the reconfigurable circuit of FIG. 1 is presented, in accordance with one embodiment of the present invention. As shown, LE array 102 comprises a plurality of enhanced LEs 200 of the present invention. In one embodiment, for example, LE array 102 comprises 128 LEs 200. Those skilled in the art will appreciate that larger or smaller arrays of LEs 200 may well be used, with a corresponding increase or decrease in the associated read/write and control circuitry to be described more fully below. For example, in an alternate embodiment, LE array 102 comprises 768 LEs 200. Nonetheless, for ease of explanation, and not limitation, the examples presented through the remainder of the application will reference LE array 102 comprising 128 LEs 200. As illustrated in FIG. 2, each LE 200 includes a multiple input—single output truth table 202, a pair of master-slave latches 204–206, output multiplexer 208, input multiplexer 212, and control logic 214, coupled to each other as shown.

Truth table 202 is used to generate a predetermined output in response to a set of inputs. For the illustrated embodiment, truth-table 202 has 4 inputs and 1 output. In other words, depending on the inputs, truth table 202 outputs 1 of $2^4$ of predetermined outputs. Each of master-slave latches 204–206 is used to store an input value synchronously with its clock input. Furthermore, each of master-slave latches 204–206 can be asynchronously forced to one or zero depending on the values of set and reset. For the illustrated embodiment, the set and reset inputs are provided using the inputs 13 and 12 of truth table 202. In other words, if set/reset is used, the number of input variations that can be provided to truth-table 202 are reduced. Alternatively, additional dedicated pins may be provided to provide the set/reset signals to master-slave latches 204–206, however the real estate requirement of the reconfigurable circuit may well be increased.

With continued reference to FIG. 2, output multiplexer 208, input multiplexer 210 and control logic 212 are used to control the manner in which truth table 202 and master-slave latches 204–206 are used. Output multiplexer 208 allows either the output of truth table 202 (by-passing master-slave latches 204–206) or the output of slave latch 206 (for level sensitive designs), or the output of master latch 204 (for edge sensitive designs) to be selected for output. The by-passed output is selected if truth table 202 is to be used standalone. When either the output of master or slave latch 204 or 206 is selected, input multiplexer 210 allows either the output of truth table 202, the feedback from output multiplexer 208, or an input value on context bus 106 to be provided to master-slave latches 204–206. The feedback value is selected to "freeze" LE 200, and the bus value is selected to initialize LE 200. Control logic 212 controls input multiplexer 210 and the set and reset values provided to master-slave latches 204–206, in accordance to a set, a reset, a first and a second enable (ENAB and EN), a load (LDE) and a hold (HLD) value provided, to be described more fully below.

Each LE 200 also includes clock selection multiplexers 216a–216c for selectively providing a number of emulation clocks or a debug clock (LD) to master-slave latches 204–206. Preferably, the emulation clocks include a "constructed" emulation clock using other LEs 200. For the illustrated embodiment, this "constructed" emulation clock is made available through I0 of truth table 202. One of the emulation clocks is provided to master-slave latches 204–206 during normal operation, whereas the debug block (LD) is provided during debugging. The clock selection is controlled by the CTX signal. Lastly, LE 200 also includes buffer 214a for outputting the selected output to inter-LE X-bar network 104 and the on-chip debugging facilities, and buffer 214b for outputting the selected output onto context bus 106 for direct observation outside reconfigurable circuit 100.

In sum, truth table 202 may be used in a standalone manner, or in conjunction with the corresponding master-slave latches 204–206. Enhanced LE 200 is suitable for "level sensitive" as well as "edge sensitive" circuit design emulations. Additionally, beside the "normal" current output of truth table 202, each LE 200 can be individually initialized. Each LE 200 can also be caused to output the same output over and over again, as if it is frozen. Furthermore, LEs 200 are individually and directly observable outside reconfigurable circuit100. In other words, there are no "hidden nodes". The state of each "node" is directly observable outside the reconfigurable circuit, without requiring the reconfiguration and time consuming re-compilation of circuit design mappings normally performed under the prior art.

Figure 3:
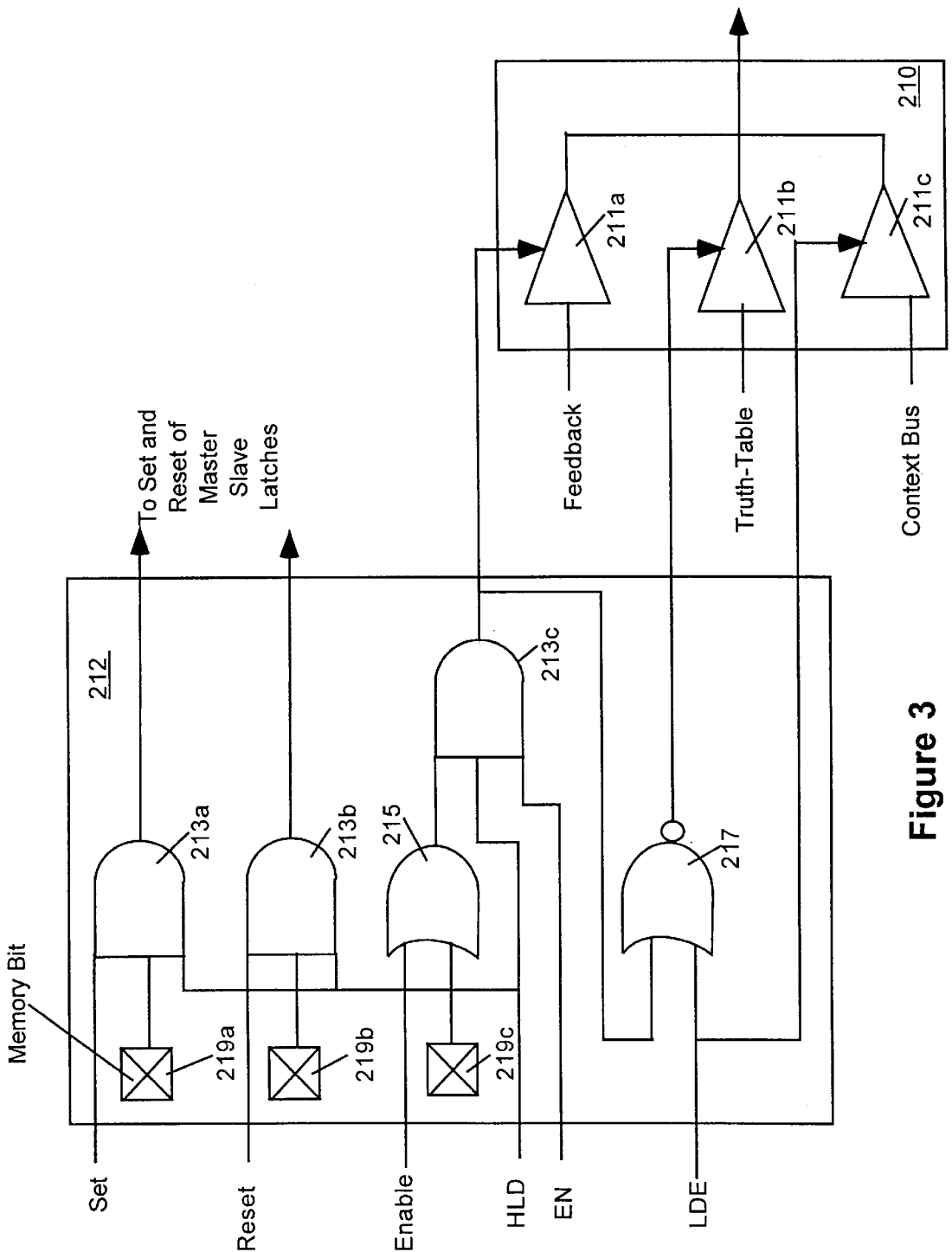
FIG. 3 illustrates one embodiment each of the control logic and input selector for the master-slave latches of FIG. 1.

FIG. 3 illustrates one embodiment each of input multiplexer 210 and control logic 212 in further detail. As shown, multiplexer 210 comprises drivers 211a–211c for outputting the feedback output, the output of truth-table 202, and the input value on context bus 106 respectively, if enabled. One of drivers 211a–211c is selectively enabled by control signals from control logic 212. Control logic 212 comprises AND gates 213a–213c, OR gate 215, NOR gate 217, and memory bits 219a–219c for generating the control signals for driver 211a–211c, as well as the set and reset values for master-slave latches 204–206. Memory bits 219a–219c are used to store configuration information for enabling the provision of the set and reset values and the selection of the feedback output. If enabled, AND gates 213a–213b provides the set and reset values in accordance to the set and HLD inputs, and the reset and HLD inputs respectively. If enabled, OR gate 215 in conjunction with AND gate 213c provide the control signal for driver 211a in accordance to the ENAB, HLD and EN inputs. NOR gate 217 provide the control signal for driver 211b in accordance to the control signal being provided for driver 211a and a LDE input. Lastly, the LDE input is provided as the control signal for driver 211c.

Figure 4A:
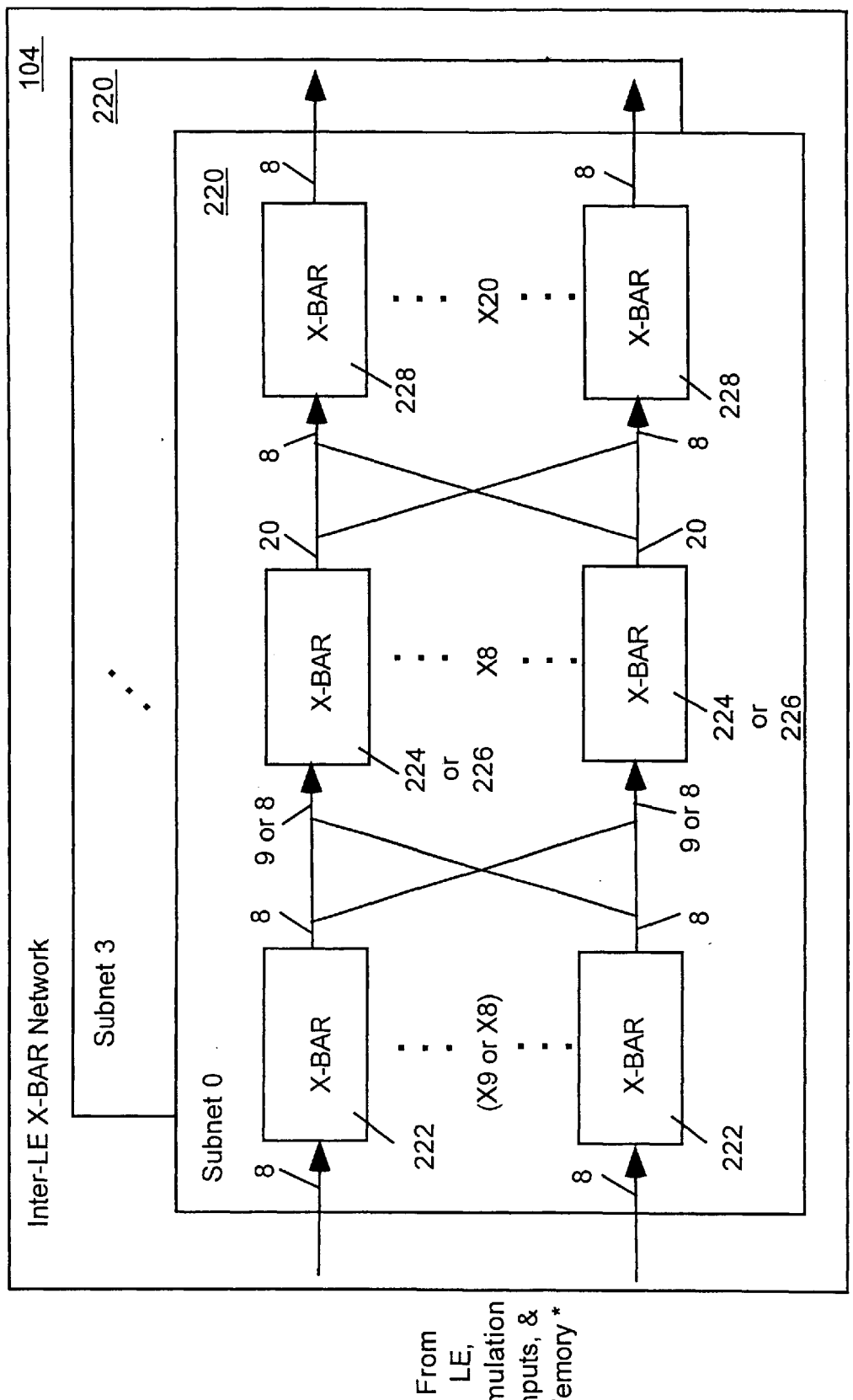
FIGS. 4a–4b illustrate one embodiment of the inter-LE crossbar network of FIG. 1
Figure 4B:
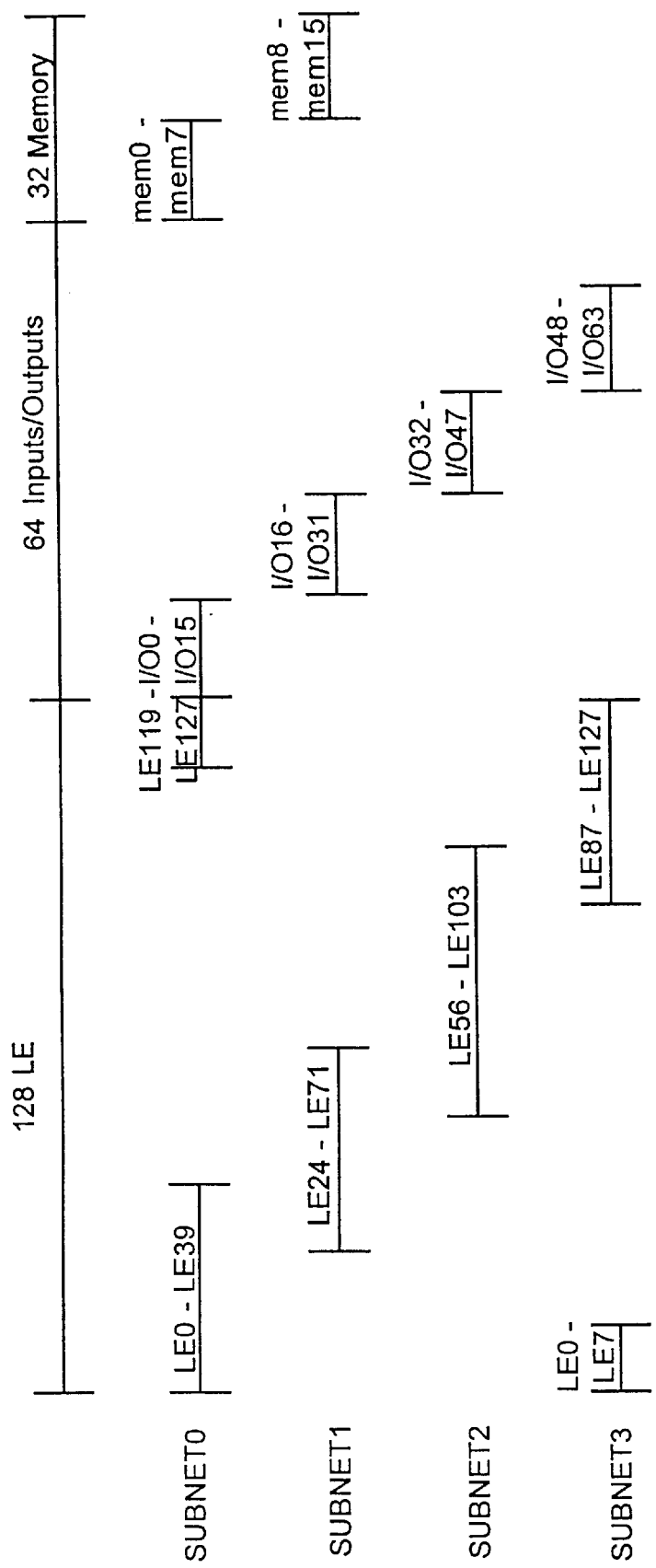

Referring now briefly to FIGS. 4a–4b, wherein one embodiment of inter-LE crossbar network 104 for interconnecting the LEs, the memory and the I/O pins is illustrated. In particular, FIGS. 4a and 4b illustrate one embodiment of an inter-LE crossbar network 104 for interconnecting 128 LEs 200. Those skilled in the art will appreciate that larger or smaller inter-LE crossbar networks may be employed without deviating from the spirit and scope of the present invention. As shown in FIG. 4a, for the illustrated embodiment, inter-LE crossbar network 104 comprises 4 subnetworks 220. The first two subnetworks, subnet0 and subnet1, are used to route 72 signals, whereas the remaining two subnetworks, subnet2 and subnet3, are used to route 64 signals. More specifically, as shown in FIG. 4b, Subnet0 is used to route the signals of LE0–LE39, LE119–LE127, I/O0–I/O15 and M0–M7. Subnet1 is used to route the signals of LE24–LE71, I/O16–I/O31 and M8–M15. Subnet2 is used to route the signals of LE56–LE103, and I/O32–I/O47. Subnet3 is used to route the signals of LE0–LE7, LE88–LE127, and I/O48–I/O63. The overlapping coverage of the LEs provides increased flexibility of signal routing for mapping circuit designs.

Each subnetwork 220 is a three-stage Claus network comprising either 9 or 8 8-to-8 crossbars 222 in the first stage, 8 9-to-20 or 8-to-20 crossbars 224 or 226 in stage two, and 20 8-to-8 crossbars 228 in stage three. The stages are coupled to each other in the well known "butterfly" manner.

For further description of inter-LE crossbar network 104, refer to the incorporated by reference U.S. Pat. No. 5,574, 388 identified above.

Figure 5:
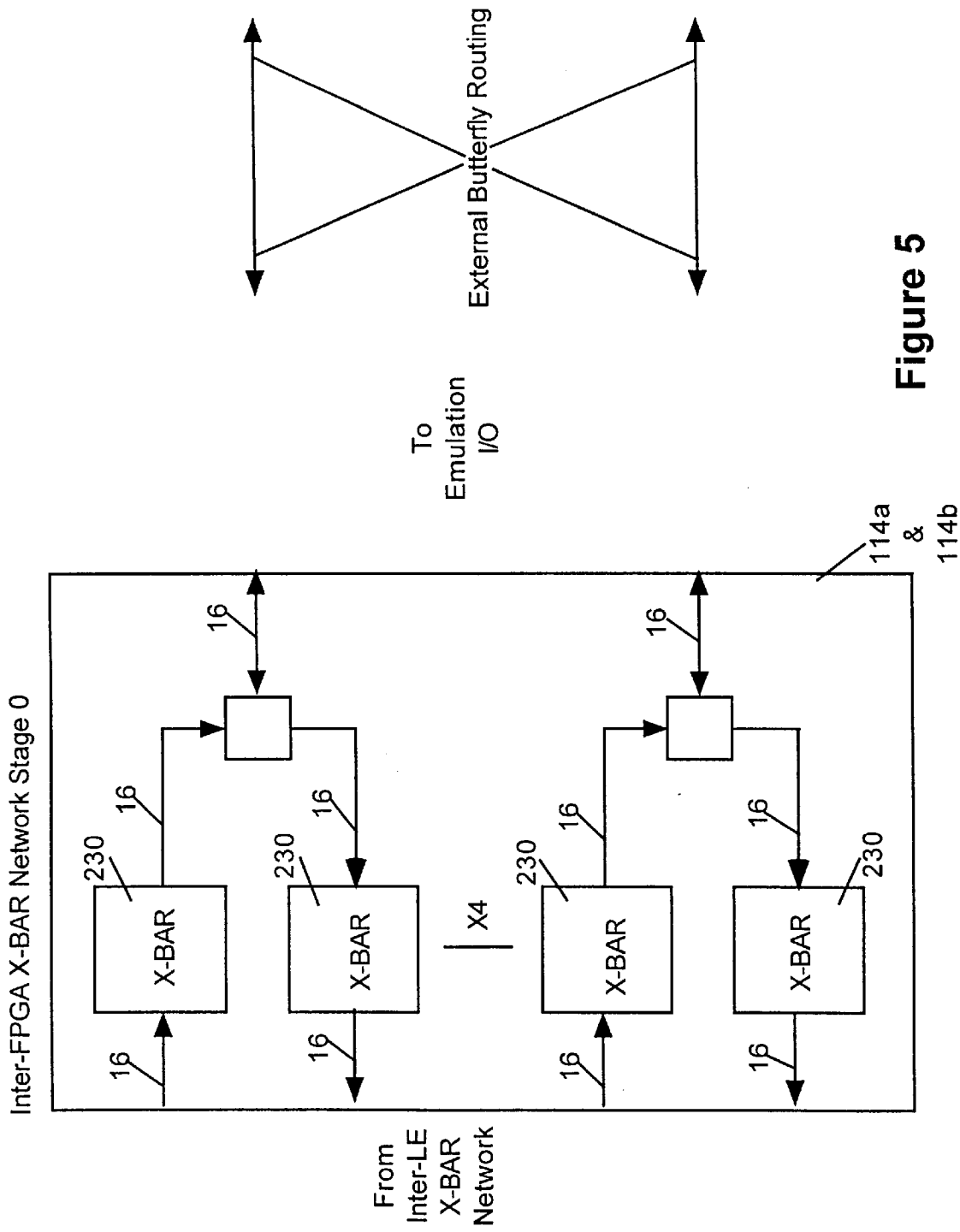
FIG. 5 illustrates one embodiment of the inter- reconfigurable circuit crossbar network stage of FIG. 1.

Referring now also briefly to FIG. 5, wherein one embodiment of inter-reconfigurable circuit crossbar network stage 114a–114b for interconnecting the reconfigurable circuit to other reconfigurable circuits and a "host" computer (not shown) is illustrated. As shown, for the illustrated embodiment, inter- reconfigurable circuits crossbar network stage0 114a–114b comprises 4 pairs of 16-to-16 crossbars 230 for coupling 64 I/O signals of the reconfigurable circuit to the next stage of a Claus network for interconnecting the reconfigurable circuit to other reconfigurable circuits and a "host" computer. For further description of inter- reconfigurable circuit crossbar network 114a–114b, also refer to the incorporated by reference U.S. Pat. No. 5,574,388 identified above.

Figure 6:
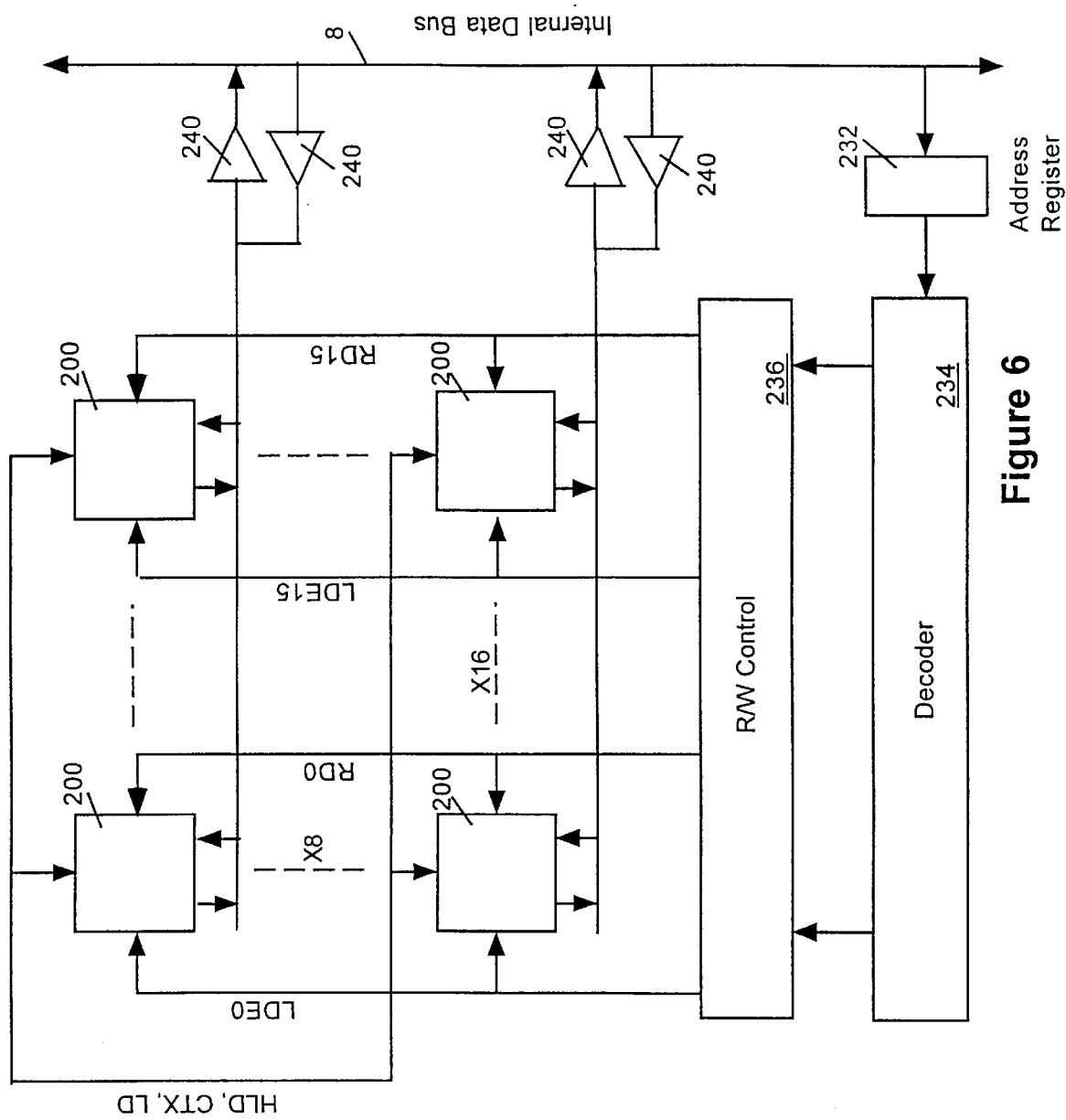
FIG. 6 illustrates one embodiment of the associated read/write facilities of the context bus of FIG. 1.

FIG. 6 illustrates one embodiment of the read/write facilities associated with context bus 106 for reading from and writing into LEs 200 of reconfigurable circuit 100. As shown, for the illustrated embodiment, 128 LEs 200 are organized in 16 columns, with each column having 8 LEs 200. Thus, all 128 LEs 200, or the current context, can be read or written with 16 8-bit words. Address register 232 is provided for storing the read or write address. Decoder 234 is provided for decoding the read or write address, which in conjunction with R/W control 236 provide the appropriate read control signals (RD0–RD15) and write control signals (LDE0–LDE15) for the 128 LEs 200. Additionally, each LE 200 receives the earlier described HLD signal for "freezing" the LEs 200, the CTX signal for selecting the debug (LD) clock, and the LD clock itself.

Figure 7B:
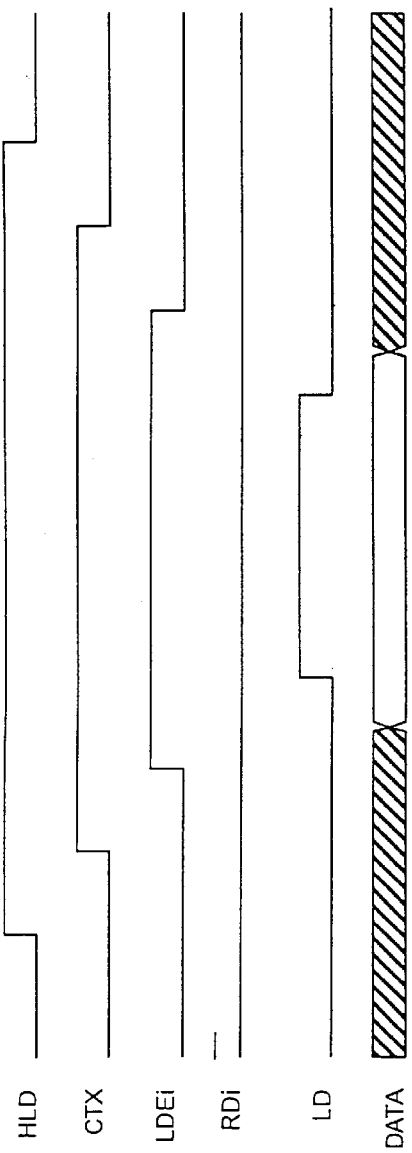
FIGS. 7a–7b are two exemplary timing diagrams illustrating the reading of a value from a LE and the writing of a value into a LE.
Figure 7A:
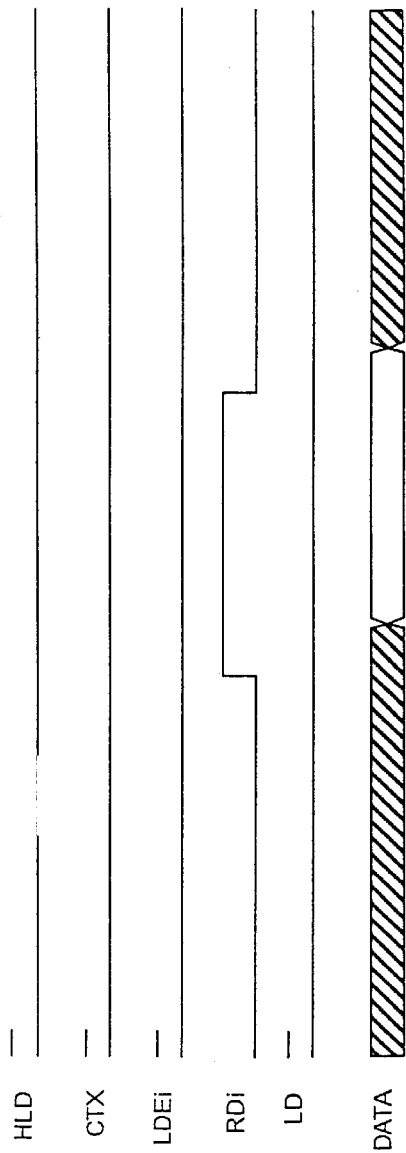

FIGS. 7a–7b illustrate exemplary signal timings for reading and writing. As shown in FIG. 7a, context reading is done by first loading a 4-bit address into address register 232. As a result, decoder 234 causes R/W control 236 to drive the appropriate RD signals high to read out the contents of the addressed LEs 200. (HLD, CTX, LDEi and LD all remain low while a read operation is in progress.) As shown in FIG. 7b, context writing is done by first loading a 4-bit address into address register 232. Additionally, before decoder 234 responds and causes R/W control 236 to drive the appropriate LDE signals high, HLD is first driven high to freeze all LEs 200. Furthermore, CTX is driven high to select debug clock LD for each LE 200. Then, when R/W control 236 drives the appropriate LDE signals, values on context bus 106 are loaded into the addressed LEs 200. It is important to freeze all LEs 200 during a context writing, because partial context could induce temporary states, which could in turn put an emulation system into an unknown state. For example, the final context may drive a given RESET signal to the low state, but the partial context (during the writing operation) may induce a temporary high state on the RESET signal, thus unpredictably resetting all the latches connected to the signal.

Figure 8A:
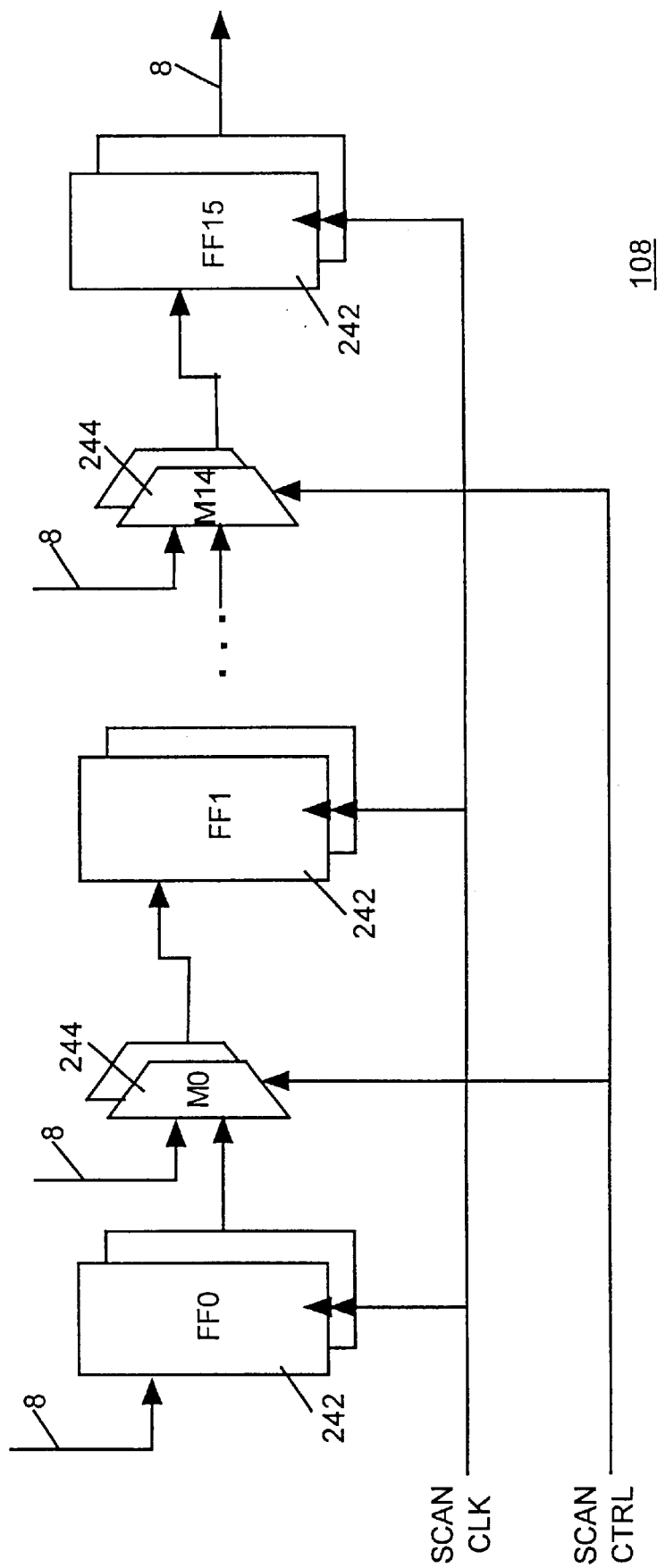
FIG. 8a illustrates one embodiment of a full scan register suitable for use in the integrated circuit of FIG. 1.

FIG. 8a illustrates one embodiment of scan register 108 for outputting a full scan of trace data for all LEs 200. In accordance with the illustrated example embodiment depicted in FIG. 8, scan register 108 comprises 16 sets of 8 flip-flops 242 and 15 sets of 8 multiplexers 244 (e.g., accommodating 128 LEs 200), wherein the multiplexers 244 are disposed in between flip-flop sets 242. Flip-flop set0 242 is coupled to a first group of 8 LEs 200. Multiplexer set0 244 is coupled to flip-flop set0 242 and a second group of LEs 200. Flip-flop set1 242 is coupled to multiplexer set0, and so forth. Flip-flop set0 242 sequentially receives and propagates the outputs of the first group of 8 LEs 200. Multiplexer set0 242 either serially provides the outputs of flip-flop set0 242 or the outputs of the second group of 8 LEs. Flip-flop set1 242 in turn sequentially propagates the inputs it received from multiplexer set0 244. Flip-flop sets 242 are controlled by a scan clock, whereas, multiplexer sets 244 are controlled by a scan control signal. Thus, by applying a scan clock having the appropriate divided frequency (relative to the operating emulation clock), and selectively applying the appropriate scan control signal to the multiplexer sets 244, a snapshot of all 128 LEs at a particular clock cycle can be sequentially scanned out of reconfigurable circuit 100.

Figure 8B:
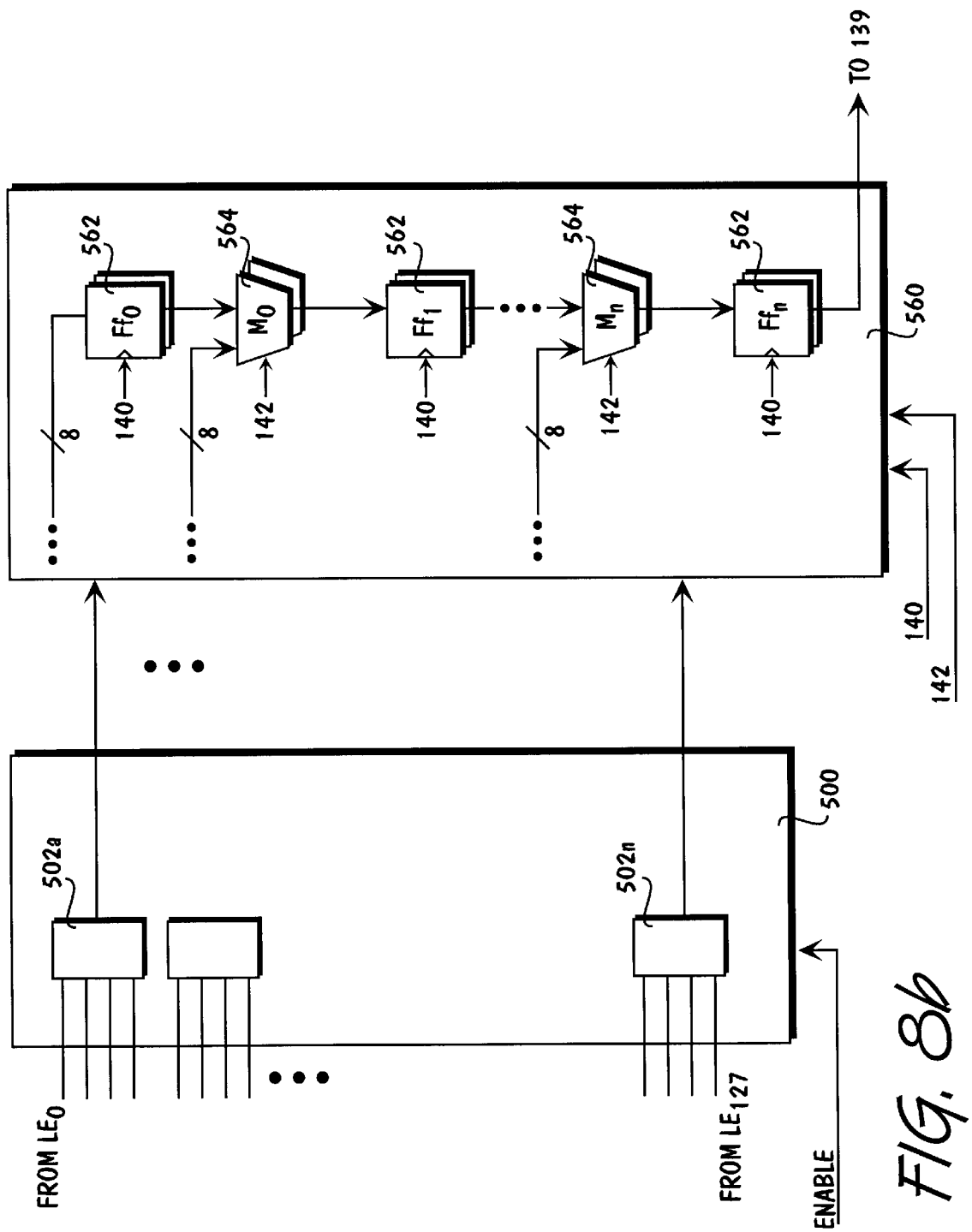
FIG. 8b illustrates a block diagram of an example dynamically reconfigurable network and partial scan register, in accordance with the teachings of the present invention, suitable for use in the integrated circuit of FIG. 1, in accordance with one embodiment of the present invention.

Turning to FIG. 8b, the integrated debugging facilities of partial scan register 135 and dynamically reconfigurable network 137 will now be described in further detail, in accordance with the teachings of the present invention. As depicted in FIG. 8b, dynamically reconfigurable network 137 is comprised of a plurality of 4:1 multiplexers 502 coupled to a plurality of LEs 200. In accordance with the illustrated example embodiment, dynamically reconfigurable network 137 is comprised of thirty-two (32) 4:1 multiplexers coupled to the output of the 128 LEs 200. Accordingly, dynamically reconfigurable network 137 enables a user to reconfigurably route a selective subset of state values for up to 32 LEs 200 to partial scan register 135.

In accordance with one embodiment of the present invention, partial scan register 135 is comprised of 4 sets of 8 flip-flops 562, and 3 sets of 8 multiplexers 564 disposed in between the flip-flop sets 562. As depicted in the illustrated example embodiment of FIG. 1, partial scan register 135 receives input from dynamically reconfigurable network 137, for output on the scan bus 139. In particular, unlike full scan register 108, partial scan register 135 outputs the state values for a subset (e.g., one-fourth) of select LEs 200 on to scan bus 139. Insofar as full scan register 108 and partial scan register 135 share scan bus 139 as an output, scan control 142 and scan clock 140 selectively control which scan register is enabled. In particular, in accordance with the illustrated example embodiment, to enable a partial scan of user selected LEs 200 within LE array 102, a user enables partial scan register 135 with scan control 142 and scan clock 140, whereas, to enable a full scan of all of the LEs 200 within LE array 102, full scan register 108 is enabled with the scan control 142 and scan clock 140 signals. Those skilled in the art, however, will recognize that alternate methods of determining which scan register is enabled may be employed. For example, in an alternate embodiment of the present invention, either scan register 108 or partial scan register 135 is selected with the mere application of scan clock 140 to the desired scan register, e.g., full scan register 108 or partial scan register 135, respectively. Thus, the present invention anticipates such modification without deviating from the scope and spirit of the present invention.

Thus, those skilled in the art will recognize that dynamically reconfigurable network 137 and partial scan register 135 endow reconfigurable circuit 100 with a new level of flexibility, enabling a user to dynamically reconfigure and view a subset of select LEs in any given clock cycle without the need for the burdensome reconfiguration and, thus, recompilation of the circuit design mapping software inherent in the prior art. Further, when it is necessary to view a complete set of state values for all of the LEs, reconfigurable circuit 100 is endowed with the innovative full scan register. Thus, given the dynamically reconfigurable integrated circuit with integrated debugging facilities of the present invention, a user of an emulation system can select to view a subset of the LEs comprising LE array 102 in one clock cycle, while selecting to view a full scan of state values for all of the LEs comprising LE array 102 in another clock cycle.

Figure 9:
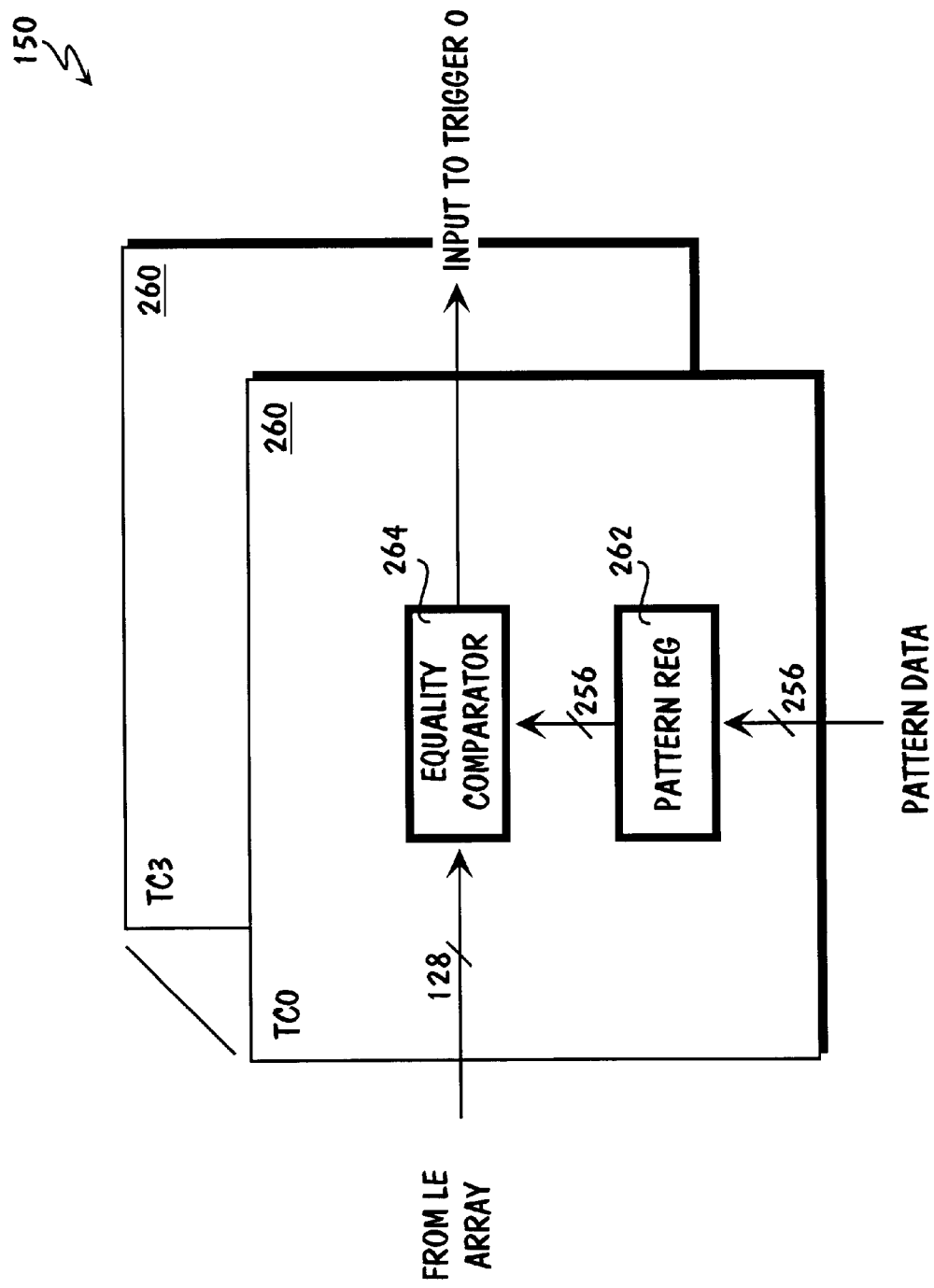
FIG. 9 illustrates one embodiment of trigger circuitry suitable for use in the integrated circuit of FIG. 1.

With reference now to FIG. 9, a block diagram of one example embodiment of trigger circuitry 110 for outputting trigger inputs is illustrated. As shown, for the illustrated embodiment, trigger circuitry 110 comprises 4 comparator-register circuits 260 for generating 4 trigger inputs, one from each comparator-register circuit 260. Each comparator-register circuit 260 includes a register 262 for storing a signal pattern, and an equality comparator 264 for comparing the outputs of the LEs to the stored content of pattern register 262. In one embodiment, the signal pattern comprises 2-bits per LE 200, allowing the values of High, Low, or Don't Care to be encoded. An input to a trigger outside reconfigurable circuit 100 is generated whenever the stored pattern is detected. In other words, for the illustrated embodiment, 4 LE internal state events can be monitored simultaneously.

Figure 10:
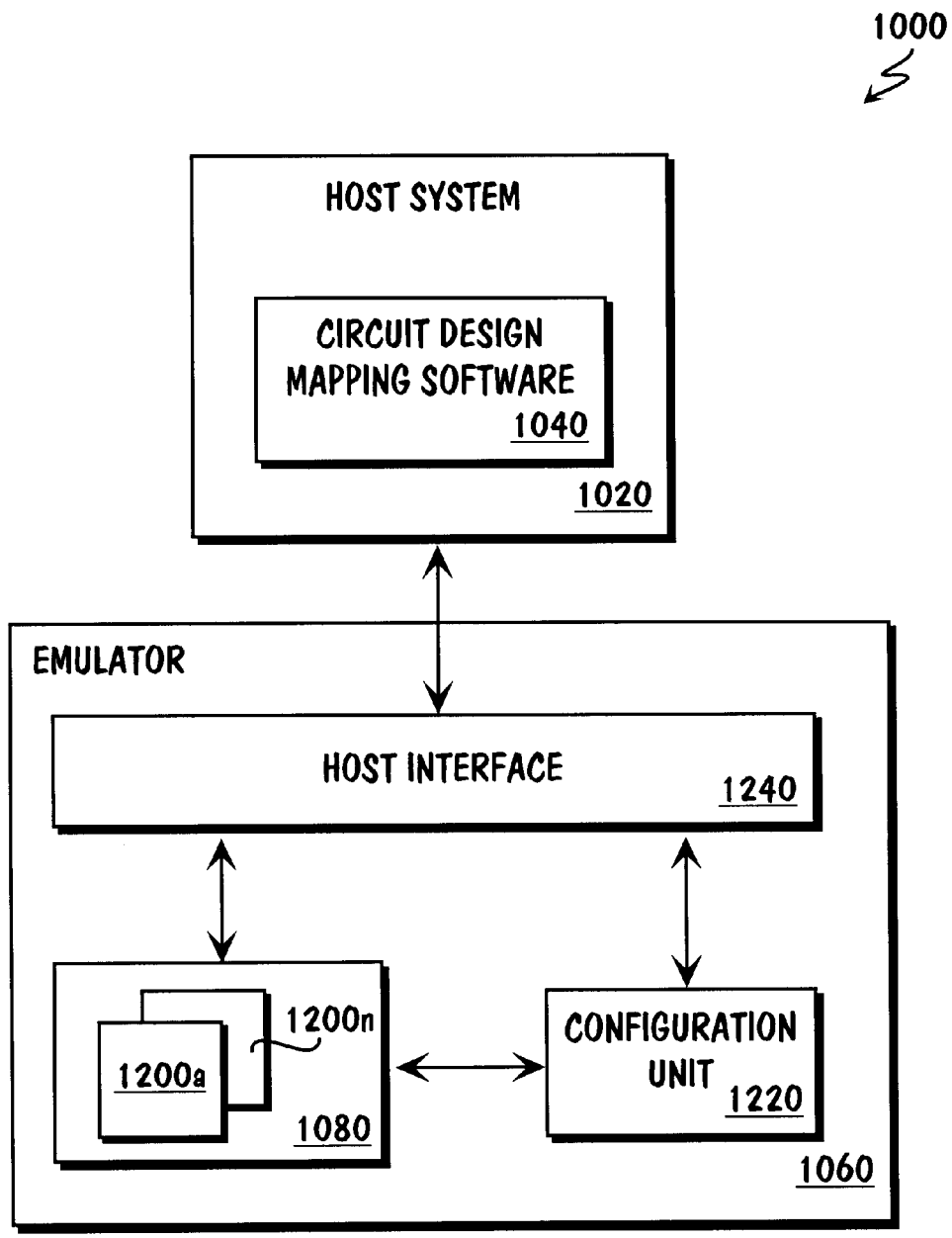
FIG. 10 illustrates a block diagram of an example emulation system incorporating the teachings of the present invention, in accordance with one embodiment of the present invention.

Turning to FIG. 10, a block diagram illustration of an example emulation system 1000 incorporating the teachings of the present invention, in accordance with one embodiment of the present invention. In accordance with the illustrated example emulation system of FIG. 11, emulation system 1000 is depicted comprising host system 1020 communicatively coupled to emulator 1060. As shown, emulator 1060 includes emulation array and interconnect networks 1080, configuration circuit 1220 and host interface 1240, communicatively coupled as depicted. In accordance with the teachings of the present invention, emulation array and interconnect networks 1080 include dynamically reconfigurable integrated circuits 1200a through 1200n of the present invention, comprising a plurality of LEs 200 which are programmably configured to emulate and "realize" a particular circuit design prior to fabrication of the circuit design. More specifically, innovative dynamically reconfigurable integrated circuits 1200a through 1200n enable a user of the emulation system to control a routing network to selectively output, via a partial scan register, a subset of the state values for select LEs, foregoing the time consuming recompilation process or a full scan output from prior art scan registers typical of prior art emulation systems. Accordingly, emulation systems incorporating the innovative features of the present invention, such as emulation system 100, enable a user of such emulation systems to dynamically change visibility points within an emulator without the time consuming process of altering and recompiling the circuit via the design mapping software, a process often measured in days for complex circuit designs.

In addition to emulation array and interconnect networks 1080, emulator 1060 is also shown comprising configuration unit 1220 and host interface 1240, all of which are coupled as shown in the example embodiment of FIG. 10. Configuration unit 1220 and host interface 1240 each perform their conventional functions known to those skilled in the art and, thus, need not be further described herein.

Those skilled in the art will appreciate that the dynamically reconfigurable integrated circuits 1200a through 1200n may well be embodied in a number of alternate forms. In one embodiment, for example, dynamically reconfigurable integrated circuits 1200a through 1200n are a corresponding plurality of reconfigurable circuit. In accordance with this example embodiment, emulation array and interconnect networks 1080 comprises a number of reconfigurable LEs which are distributively packed in a number of reconfigurable circuits, which in turn are distributively packaged in a number of logic boards. A number of logic boards may well be combined together to form a crate. For multi-crate embodiments, a number of crates are combined together. A scaleable multi-level multi-stage network topology is employed to interconnect the LEs together within the reconfigurable circuits, and then the reconfigurable circuits, the logic boards, and the crates.

In addition to emulator 1060 incorporating the teachings of the present invention, example emulation system 1000 further comprises host system 1020 having circuit design mapping software 1040. Those skilled in the art will appreciate that circuit design mapping software 1040 may well be any of a number of alternative design mapping software applications known in the art. In accordance with the illustrated example embodiment of FIG. 10, circuit design mapping software 1040 is stored in a suitable storage medium (not shown) of host system 1020, and is loaded into memory (not shown) of host system 1020 for execution by a processor (not shown) of host system 1020. Host system 1020 in general, and design mapping software 1040 in particular, are intended to represent any of a number of host systems and circuit design mapping software commonly used in the circuit emulation art and, thus, need not be further described here.

Thus, a reconfigurable integrated circuit with integrated debugging facilities that is particularly suitable for emulation systems has been described. While the method and integrated circuit of the present invention has been described in terms of the above illustrated embodiments, those skilled in the art will recognize that the invention is not limited to the embodiments described. The present invention can be practiced with modification and alteration without deviating from the spirit and scope of the appended claims Further, as provided above, the present invention anticipates that dynamically reconfigurable integrated circuits of greater or less complexity. In particular, the present invention anticipates increased or decreased LE array sizes for LE array 102, with corresponding increases/decreases in the read/write/crossbar/control circuitry required to support such an LE array. Thus, the description is to be regarded as illustrative instead of restrictive on the present invention.

What is claimed is:

1. An integrated circuit for use in an emulation system comprising:

a plurality of logic elements (LEs) reconfigurable to emulate circuit elements of an integrated circuit design, each of which having a plurality of outputs, wherein the LEs are operative to generate a plurality of output signals in response to a plurality of input signals correspondingly applied to the LEs;

a partial scan register to capture and output on a scan bus a record of signal state values of circuit elements emulated by a selected subset of LEs in a particular clock cycle of an operating clock; and a reconfigurable network coupled to the plurality of LEs and the partial scan register to exclusively and reconfigurably connect the partial scan register to the selected subset of LEs in the particular clock cycle of the operating clock.

2. The integrated circuit of claim 1, wherein the partial scan register is selectively enabled with application of a scan clock appropriately scaled to the operating clock.

3. The integrated circuit of claim 1, further comprising:

a full scan register, coupled to the LEs, operative to capture and output on the scan bus a record of all signal state values of the LEs in a particular clock cycle, wherein the full scan register is enabled with application of the scan clock.

4. The integrated circuit of claim 3, wherein the integrated circuit is operative to provide either full scan capability via the full scan register, or partial scan capability via the partial scan register.

5. The integrated circuit of claim 1, further comprising a trigger circuit, coupled to the LEs, operative to conditionally generate at least one trigger value based, at least in part, on the signal state values of the LEs.

6. The integrated circuit of claim 1, further comprising:
an interconnect network, coupled to the plurality of LEs and a plurality of integrated circuit outputs, operative to route signals in and between the plurality of LEs and integrated circuit outputs in accordance with a recompilable set of instructions configuring the interconnect network.

7. The integrated circuit of claim 6, wherein the reconfiguration of the interconnect network requires recompilation of a new set of instructions.

8. The integrated circuit of claim 7, wherein the reconfiguration of the interconnect network renders the integrated circuit unable to emulate circuit elements.

9. An emulation system comprising:
a host; and
an emulation board, the emulation board comprising,
    a plurality of board input/output (I/O) pins, at least a subset of which are communicatively coupled to the host; and
    an integrated circuit (IC), having a plurality of IC input/output pins, at least a subset of which are coupled to the board I/O pins, the IC comprising,
        a plurality of logic elements (LEs) reconfigurable to emulate circuit elements of an integrated circuit design, each of which having a plurality of outputs, wherein the LEs are operative to generate a plurality of output signals in response to a plurality of input signals correspondingly applied to the LEs; and
        a partial scan register to capture and output on a scan bus a record of signal state values of circuit elements emulated by the selected LEs in a particular clock cycle of an operating clock, and
        a reconfigurable network coupled to the plurality of LEs and the partial scan register to exclusively and reconfigurably connect the partial scan register to the selected subset of LEs in the particular clock cycle of the operating clock.

10. The emulation system of claim 9, wherein the integrated circuit further comprises:
a full scan register, coupled to the LEs, operative to capture and output on the scan bus a record of all signal state values of the LEs in a particular clock cycle of the operating clock.

11. The emulation system of claim 10, wherein the full scan register is selectively enabled with application of the scan clock.

12. The emulation system of claim 10, wherein the integrated circuit is operative to provide a full scan of all of the signal state values of the LEs via the full scan register, or a partial scan of signal state values of select LEs via the partial scan register, when enabled.

13. The emulation system of claim 9, further comprising a trigger circuit, coupled to the LEs, operative to conditionally generate at least one trigger value based, at least in part, on the signal state values of the LEs.

14. The emulation system of claim 9, wherein the integrated circuit further comprises:
an interconnect network, coupled to the LEs and a plurality of integrated circuit inputs and outputs (I/O), operative to route signals in and between the plurality of LEs and integrated circuit I/O in accordance with a recompilable set of instructions configuring the interconnect network.

15. The emulation system of claim 14, wherein reconfiguration of the interconnect network requires recompilation of a new set of instructions.

16. An emulator board comprising:
a plurality of input/output (I/O) pins; and
an integrated circuit coupled to the plurality of (I/O) pins, the integrated circuit including:
    a plurality of logic elements (LEs) reconfigurable to emulate circuit elements of an integrated circuit design, each of which having a plurality of outputs, wherein the LEs are operative to generate a plurality of output signals in response to a plurality of input signals correspondingly applied to the LEs;
    a partial scan register to capture and output on a scan bus a record of signal state values of circuit elements emulated by the selected LEs in a particular clock cycle of an operating clock, wherein the partial scan register is enabled with application of a scan clock appropriately scaled to the operating clock; and
    a reconfigurable network coupled to the plurality of LEs and the partial scan register to exclusively and reconfigurably connect the partial scan register to the selected subset of LEs in the particular clock cycle of the operating clock.

17. The emulator board of claim 16, wherein the integrated circuit further comprises:
a full scan register, coupled to the LEs, operative to capture and output on the scan bus a record of all signal state values of the LEs in a particular clock cycle of the operating clock, when enabled.

18. The emulator board of claim 17, wherein the integrated circuit is operative to provide either full scan capability via the full scan register, or partial scan capability via the partial scan register, when enabled with application of the scan clock.

19. The emulator board of claim 16, wherein the integrated circuit further comprises
a trigger circuit, coupled to the LEs, operative to conditionally generate at least one trigger value based, at least in part, on the signal state values of the LEs.

20. The emulator board of claim 16, wherein the integrated circuit further comprises:
an interconnect network, coupled to the LEs and a plurality of integrated circuit inputs and outputs (I/O), operative to route signals in and between the plurality of LEs and integrated circuit I/O, in accordance with a recompilable set of instructions configuring the interconnect network.

21. The emulator board of claim 20, wherein reconfiguration of the interconnect network requires recompilation of a new set of instructions.

22. An integrated circuit for use in an emulation system comprising:
a plurality of logic elements (LEs) reconfigurable to emulate circuit elements of an integrated circuit design, each of which having a plurality of outputs, wherein the LEs are operative to generate a plurality of output signals in response to a plurality of input signals correspondingly applied to the LEs;

a partial scan register, reconfigurably coupled to select ones of the LEs such that, when enabled, the partial scan register is operative to capture and output on a scan bus a record of signal state values of circuit elements emulated by the selected LEs in a particular clock cycle of an operating clock, when enabled with application of a scan clock; and a full scan register, coupled to the LEs, operative to capture and output on the scan bus a record of all signal state values of the LEs in a particular clock cycle of the operating clock, when enabled with application of a scan clock.

23. The integrated circuit of claim 22, wherein either the partial scan register or the full scan register is enabled with the scan clock in a particular clock cycle of an operating clock.

* * * * *

UNITED STATES PATENT AND TRADEMARK OFFICE
CERTIFICATE OF CORRECTION

PATENT NO.    : 6,265,894 B1
DATED         : July 24, 2001
INVENTOR(S)   : Reblewski et al.

It is certified that error appears in the above-identified patent and that said Letters Patent is hereby corrected as shown below:

Drawings,
Fig. 1, substitute Fig. 1 with the attached Fig. 1.
Fig. 9, item "150" should read -- 110 --.
Fig. 11, substitute Fig. 11 with the attached Fig. 11.

Column 2,
Line 22, "stage" should read -- stage0 --.

Column 4,
Line 50, "subset there of That is" should read -- subset there of. That is --.

Column 5,
Line 30, "inputs 13 and 12 of truth" should read -- inputs I3 and I2 of truth --.

Column 6,
Lines 61-62, "I/O32-I/047" should read -- I/O32-I/O47 --.
Line 63, "I/048-I/063" should read -- I/O48-I/O63 --.

Column 7,
Line 9, "network stage" should read -- network stage0 --.

Signed and Sealed this

First Day of April, 2003

JAMES E. ROGAN
*Director of the United States Patent and Trademark Office*